(12) United States Patent
Canedo et al.

(10) Patent No.: US 8,412,496 B2
(45) Date of Patent: Apr. 2, 2013

(54) SIMULATION SYSTEM, METHOD, AND PROGRAM

(75) Inventors: Arquimedes Martinez Canedo, Kanagawa-ken (JP); Hideaki Komatsu, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 12/791,096

(22) Filed: Jun. 1, 2010

(65) Prior Publication Data

US 2010/0305926 A1    Dec. 2, 2010

(30) Foreign Application Priority Data

Jun. 2, 2009    (JP) ................................. 2009-133329

(51) Int. Cl.
*G06F 17/50* (2006.01)

(52) U.S. Cl. ......... 703/2; 703/14; 714/15; 714/E11.128; 707/674; 707/687

(58) Field of Classification Search ................ 703/2, 14; 714/15, E11.128; 707/674, 687
See application file for complete search history.

(56) References Cited

U.S. PATENT DOCUMENTS

| | | | |
|---|---|---|---|
| 2008/0148094 A1* | 6/2008 | Manning et al. | 714/5 |
| 2009/0070281 A1* | 3/2009 | Solomon | 706/13 |
| 2009/0070486 A1* | 3/2009 | Visser | 709/238 |
| 2009/0089078 A1* | 4/2009 | Bursey | 705/1 |
| 2010/0139659 A1* | 6/2010 | von Blumenthal | 128/204.23 |
| 2011/0125716 A1* | 5/2011 | Drews et al. | 707/674 |
| 2012/0005338 A1* | 1/2012 | Visser | 709/224 |

FOREIGN PATENT DOCUMENTS

| | | |
|---|---|---|
| JP | 8227367 | 9/1996 |
| JP | 9319722 | 12/1997 |
| JP | 10-074214 A | 3/1998 |
| JP | 10-161906 A | 6/1998 |
| JP | 10-261002 A | 9/1998 |
| JP | 2001290860 | 10/2001 |
| JP | 2004030228 | 1/2004 |
| JP | 2004272826 | 9/2004 |
| JP | 2006065758 | 3/2006 |
| JP | 2008151047 | 7/2008 |

* cited by examiner

*Primary Examiner* — Thai Phan
(74) *Attorney, Agent, or Firm* — Eustus D. Nelson (57) ABSTRACT

A system, method and program to improve the processing speed of a simulation system. A processing system finds an entry point so that functional blocks cover a broad range. The processing system places code of a look-ahead dispatcher for assigning processing. The look-ahead dispatcher monitors an input state at the entry point to determine whether the input state is a stable state. If the input state is stable, the look-ahead dispatcher calls an adaptive execution module at some frequency or otherwise calls an idle execution module. The adaptive execution module performs processing on multiple timestamps at once. When a discrete system receives an input event, the look-ahead dispatcher calls a recovery execution module. Based on the input event on that occasion, the timestamp, and a value stored in a state vector, the recovery execution module calculates a state for which recovery is performed.

12 Claims, 11 Drawing Sheets

SIMULATION SYSTEM, METHOD, AND PROGRAM

CROSS REFERENCE TO RELATED APPLICATION

This application claims priority under 35 U.S.C. §119 from Japanese Patent Application No. 2009133329 filed Jun. 2, 2009, the entire contents of which are incorporated by reference herein.

BACKGROUND OF THE INVENTION

1. Field of the Invention

The present invention relates to a simulation technique using a computer. More particularly, the present invention relates to a system, a method, and a program for software-based simulation of a physical unit such as the engine of an automobile.

2. Description of the Related Art

In the early 20th century, an automobile was made up of an engine as a power source, and mechanical parts including a brake, an accelerator, a steering wheel, a transmission, and a suspension, with little use of electrical mechanisms except for an ignition plug for the engine and headlights.

However, around the 1970s, there arose the need to control the engine efficiently in preparation for air pollution and oil crisis. Thus, an ECU started to be used for engine control. In general, the ECU includes an input interface used, for example, for AD conversion of an input signal from a sensor, a logical operation unit (microcomputer) for processing a digital input signal according to predetermined logic, and an output interface for converting the processing result into an actuator operating signal.

A significant proportion of recent automobiles are now occupied not only by mechanical parts but also by electronic components and software, which range from control systems for the engine and the transmission, an anti-lock braking system (ABS), electronic stability control (ESC), and power steering, to wiper control, and a security monitoring system. The development cost for the latter is said to be 25% or 40% of the total cost, and accounts for 70% in a hybrid car.

Multiple ECUs are arranged to provide electronic control. The ECUs are connected to each other via an in-vehicle network such as a controller area network (CAN). The engine and transmission, which are to be controlled, are wire-connected directly to the respective ECUs.

The ECU is a small computer, and is operated according to an interrupt from a sensor input, for example. Meanwhile, the engine continuously performs mechanical operations. In other words, a computer digital system and a mechanical physical system perform cooperative operations in parallel in a single system as an automobile. Naturally, software supporting those operations has become more and more complicated. Therefore, it is desired to achieve a mechanism not only for verifying the operation of a single ECU but also for verifying the operations of multiple ECUs at the same time.

Meanwhile, actuators driven by an output signal from respective ECUs include an electromagnetic solenoid, a motor, for example. The solenoid is used, for example, for an injector of the engine, shift control of the transmission, brake valve control, and a door lock.

As a conventional technique for testing such devices, there is HILS (Hardware In the Loop Simulation). Particularly, an environment for testing all the ECUs in the automobile is called full-vehicle HILS (Hardware In the Loop Simulation). In the full-vehicle HILS, a test is conducted in a laboratory according to a predetermined scenario by connecting a real ECU to a dedicated hardware device emulating an engine, or a transmission mechanism. The output from the ECU is input to a monitoring computer, and further displayed on a display to allow a person in charge of the test to check if there is any abnormal action while viewing the display.

However, in HILS, the dedicated hardware device is used and the device and the real ECU have to be physically wired. Thus, HILS involves a lot of preparation. Further, when a test is conducted by replacing the ECU with another, the device and the ECU have to be physically reconnected, requiring even more work. Further, because the test uses the real ECU, it takes actual time to conduct the test. Therefore, it takes an immense amount of time to test many scenarios. In addition, the hardware device for emulation of HILS is generally very expensive.

Therefore, a technique using software without using such an expensive emulation hardware device has recently been employed. This technique is called SILS (Software In the Loop Simulation), in which all components to be mounted in the ECU, such as a microcomputer, an I/O circuit, and a control scenario, are configured by using a software simulator. This enables the test to be conducted without the hardware of the ECU.

In the meantime, a simulation system for automobiles includes a continuous system simulator and a discrete system (discrete event) simulator. An example of the continuous system simulator is a simulator for simulating a mechanical part of the engine. An example of the discrete event simulator is a simulator for an ECU operated with pulse timing of the engine rotation to control the timing of fuel injection or ignition.

For simulation of a 4WD, there is a simulator for repeatedly calculating the behavior of the car from the torque distribution to each wheel as an example of the continuous system simulator, and there is a simulator operated with a periodic pulse signal output at every interval of 10 milliseconds to simulate an ECU to determine the torque distribution to each wheel from a sensor input such as the yaw rate of the car as an example of the discrete event simulator.

Since it takes a lot of time to conduct a test along a specific test scenario in such a system, there is a constant demand for improvement in processing speed to reduce the overall time.

Japanese Patent Application Publication No. 2001-290860 aims at providing a hardware/software cooperation simulator, which finds unnecessary synchronization processes between simulators to reduce the number of synchronization processes in order to improve the simulation speed. The simulator includes simulation cooperation means for synchronizing CPU simulation means with peripheral circuit simulation means, and determination means for determining whether to inhibit the synchronization achieved by the simulation cooperation means, wherein the synchronization achieved by the simulation cooperation means is inhibited based on the determination means.

Japanese Patent Application Publication No. 8-227367 aims at obtaining a debugger for increasing a debug speed by using a high-speed simulator in which all system operations but a system operation whose design error is expected are ignored. The debugger includes a bus simulator of a bus for providing a signal corresponding to a bus cycle for mutually connecting each simulator, and means for omitting a bus cycle unnecessary for the simulation, wherein a CPU bus cycle unrelated to the simulation is omitted, or only the schedule of a periodic clock signal is generated without explicitly simulating the clock signal.

Japanese Patent Application Publication No. 2004-30228 discloses a configuration including a CPU simulator, one or more peripheral macro-simulators, and execution of synchronization control processing part for controlling the execution of synchronization therebetween. When a signal input to a terminal based on simulation by the CPU simulator is changed, the peripheral macro-simulator performs simulation based on the terminal signal changed, detects the change in the input terminal signal, registers the changed terminal signal in a terminal signal list 22, and performs simulation on only the registered terminal signal.

Japanese Patent Application Publication No. 2006-65758 discloses a circuit simulation technique in which a second discrete-time model is created by applying a response function to a first discrete-time model created from circuit data, and the edge timing of a clock and the effective signal value of a signal input/output to/from a clock synchronization circuit are calculated using the second discrete-time model to perform simulation.

Although these conventional techniques can help improve the execution speed of a normal simulation system, it is difficult to apply them to a discrete system driven on an event basis such as an ECU emulator.

Therefore, inventors including those of the present application disclose, in the specification of Japanese Patent Application No. 2008-151047, a technique capable of improving the processing speed of a simulator as follows: A physical unit simulator is allowed to speculatively perform high-speed continuous operations under normal conditions. Only when an actual input comes in, a speculative input and the actual input are compared with each other. In response to inconsistency between the inputs, the physical unit simulator is returned to a point closest to the point of the actual input and is allowed to execute a variable step until it reaches the point of the actual input. Upon arrival at the point of the actual input, the simulator gets back to the high-speed continuous operations from the point.

SUMMARY OF THE INVENTION

In the technique described in the specification of the above-mentioned Japanese Patent Application No. 2008-151047, the cost for recovery processing upon unsuccessful speculation is relatively high.

Therefore, the present invention provides a technique capable of retrying simulation at a relatively low cost when the speculative input and the actual input are different.

The present invention assumes that a simulation processing program preferably consists of multiple functional blocks connected to each other. These functional blocks can be created by a simulation tool such as Matlab®/Simulink®.

In a technique according to the present invention, an entry point is first found in automated processing performed by a computer so that the functional blocks each having an internal state will cover a broad range. Then, at the entry point, a processing system according to the present invention places code of a look-ahead dispatcher for assigning processing preferably to either of a normal execution module, an adaptive execution module, a recovery execution module, and an idle execution module.

The look-ahead dispatcher monitors an input state at the entry point to determine whether the input state is a stable state. This determination can be made, for example, by detecting the frequency or variations of input values coming during a fixed time period.

If the input state is stable, the look-ahead dispatcher calls the adaptive execution module at some frequency or otherwise calls the idle execution module. The adaptive execution module performs processing on multiple timestamps at once on the assumption that the input state is constant. The number of steps to be executed at once can be any value, but preferably four to eight. The internal state of the adaptive execution module is stored in a state vector sequentially. The state vector is an array of variables arranged in a region preferably reserved in a main memory. Preferably, the number of dimensions thereof is set equal to the number of steps executed at once by the adaptive execution module.

The idle execution module gives interpolated outputs based on the history of output values.

When determining that it is in an unstable input state, the look-ahead dispatcher calls the normal execution module. The normal execution module performs sequential processing on a timestamp basis.

When a discrete system receives an input event, the look-ahead dispatcher calls the recovery execution module. Based on the input event on that occasion, the timestamp, and a value stored in the state vector, the recovery execution module calculates a state for which recovery is performed to restart processing itself based on the state.

According to this invention, because a steady state is detected to perform processing on multiple timestamps at once, the processing speed can be improved. In addition, the storage of sequential states into the state vector enables a response to an input in a state of sudden change to immediately start recovery processing, thus dealing with a change in input.

The technique of the present invention can be implemented relatively easily by converting and adding code to the simulation system having existing functional blocks in a processing system level of a compiler.

DETAILED DESCRIPTION OF THE PREFERRED EMBODIMENTS

A configuration and processing of one preferred embodiment of the present invention will now be described with reference to the accompanying drawings. In the following description, the same components are denoted by the same reference numerals throughout the drawings. Although the configuration and processing are described here as one preferred embodiment, it should be understood that the technical scope of present invention is not intended to be limited to this embodiment.

Figure 1:
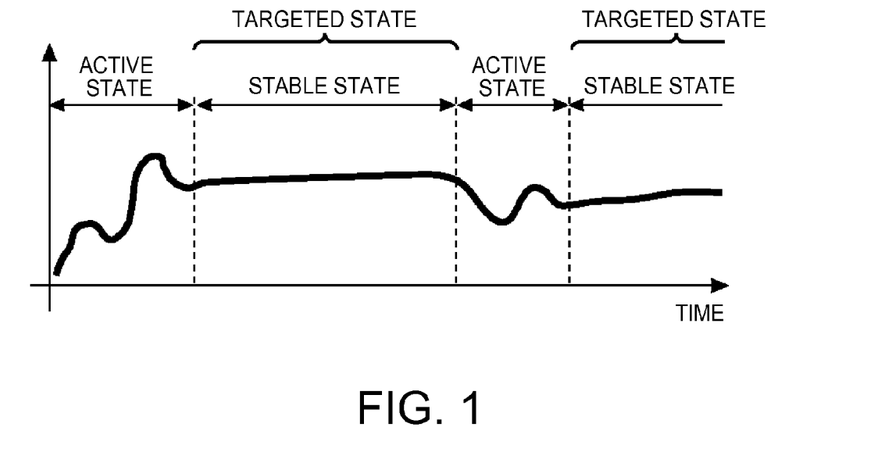
FIG. 1 is a chart showing state transitions of inputs to a simulation system.

Before describing a specific configuration to carry out the present invention, the background and principle of the present invention will be described. FIG. 1 is a chart showing the time variation of input to a simulation system to which the present invention is applied. Particularly, in a discrete system such as an ECU emulator for an engine in an automobile simulation system, its input signal consists of two state periods, namely a relatively short active state period in which the value of the input signal largely varies with time and a relatively long stable state period in which the value of the input signal does not vary significantly.

Therefore, the inventors of the present application have focused on the variation of this input signal, and intended to operate the simulation system normally in relatively fine steps during the period of the input signal in the active state, and operate the simulation system in relatively coarse steps during the period of the input signal in the stable state in order to improve the operation speed of the entire system.

Figure 2:
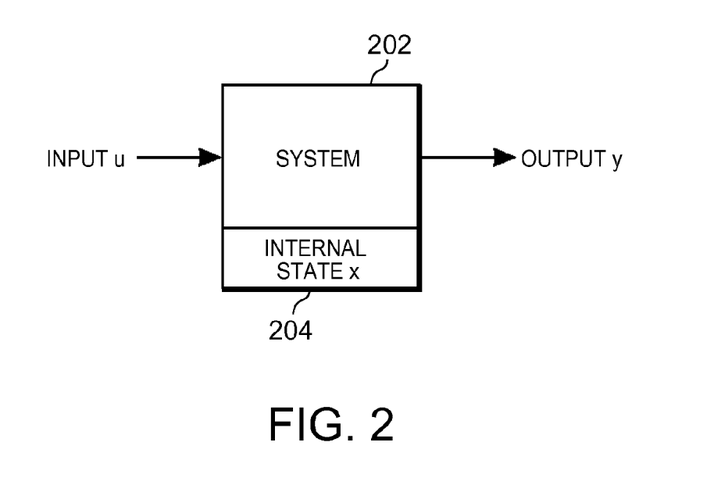
FIG. 2 is a schematic block diagram showing input, output, and an internal state of the simulation system.

FIG. 2 is a block diagram schematically showing the operation of a simulation system 202. The system 202 generally has an internal state x as indicated by reference numeral 204. If an input to the system 202 is u and an output is y, the following equations are generally given:

$$x = Ax + Bu$$

$$y = Cx + Du$$

Here, A, B, C, and D are coefficients.

If u is written as input, x is written as state, y is written as output, and the equation x=Ax+Bu is expressed as function f( ) it is expressed as $$state_{k+1} = f(state_k, input)$$

Here, $state_k$ denotes an internal state in the kth timestamp.

Similarly, if the equation y=Cx+Du is expressed as function g( ) it is expressed as output=g($state_k$, input).

Under the $state_k$, the iteration of processing for receiving an input called input and outputting output can be described in the following pseudo-code:

```
while simulation == true
    state_{k+1}:=f(state_k,input)
    output:=g(state_k,input)
endwhile
```

Here, the simulation continues its simulation operation while it is true. Then, when stopping the simulation operation, it assumes that a logic variable is set to false.

The above code is nearly equivalent to the following code:

```
while simulation == true
    state_{k+1}:=f(state_k,input_k)
    output_1:=g(state_{k+1},input_k)
    state_{k+2}:=f(state_{k+1},input_{k+1})
    output_2:=g(state_{k+2},input_{k+1})
endwhile
```

Because calculations such as $state_{k+1}$ and $output_1$ are made in order after waiting for $input_1$ and $input_2$ to come, the processing requires time.

However, it can be assumed that the input hardly varies during the period of the stable state as shown in FIG. 1. Therefore, the above code can be rewritten as follows:

```
while simulation == true
    state_{k+1}:=f(state_k,input)
    state_{k+2}:=f(state_{k+1},input)
    output_{k+2}:=g(state_{k+1},input)
endwhile
```

Here, the reason why $output_1 = g(state_{k+1}, input)$ is omitted is because the output varies virtually linearly while the input is constant. Hence, it is assumed that calculations can be made on the way simply using linear interpolation without making calculations all over again. This will be described in detail later.

The above code is further expanded as follows:

```
while simulation == true
    state_{k+1}:=f(state_k,input)
    state_{k+2}:=f(state_{k+1},input)
    state_{k+3}:=f(state_{k+2},input)
    ...
    output_n:=g(state_{k+n-1},input)
endwhile
```

Here, in this embodiment, n is called a look-ahead factor. As shown, in the present invention, constant input is assumed during the period of the stable state to produce timestamps for n look-ahead factors at once, thereby enabling speeding up of the processing during the period of the stable state.

According to the present invention, the preferred number n of look-ahead factors is about four to eight. Further, according to the present invention, it is preferred that state vectors having entries for n look-ahead factors are prepared in a memory at once in the simulation system and calculated states are stored therein in order. As will be described in detail later, the states stored here are used by subsequent recovery processing.

Figure 3:
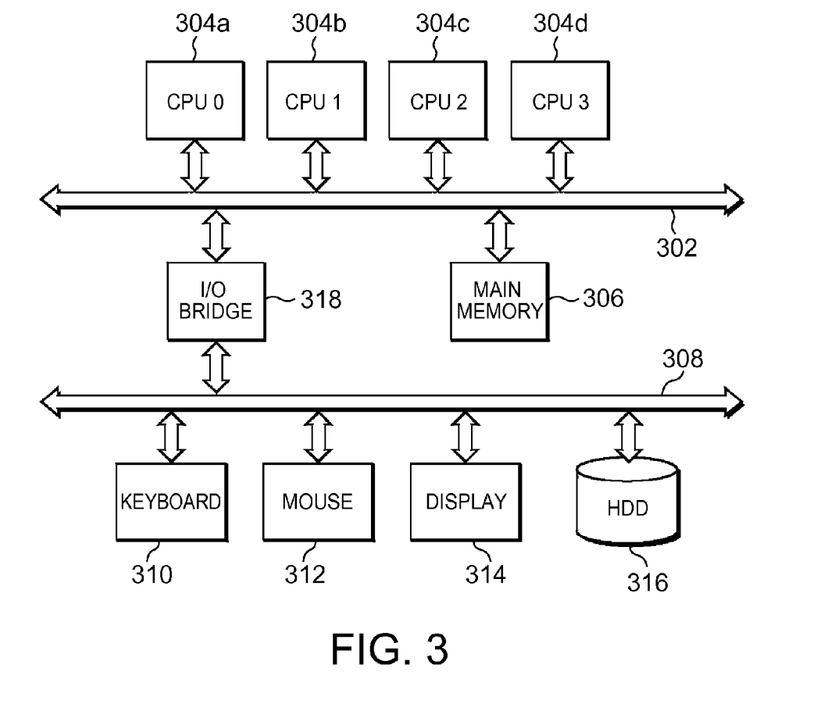
FIG. 3 is a block diagram of a hardware configuration for carrying out the present invention.

Referring next to FIG. 3, hardware of a computer used in carrying out the present invention will be described. In FIG. 3, multiple CPUs, namely CPU0 304a, CPU1 304b, CPU2 304c, and CPU3 304d, are connected to a host bus 302. A main memory 306 for arithmetic processing performed by the CPU0 304a, CPU1 304b, CPU2 304c, and CPU3 304d is also connected to the host bus 302.

A keyboard 310, a mouse 312, a display 314, and a hard disk drive 316 are connected to an I/O bus 308. The I/O bus 308 is connected to the host bus 302 through an I/O bridge 318. The keyboard 310 and the mouse 312 are used by an operator to carry out operations such as to enter a command and click on a menu. The display 314 is used to display a screen image for operating with a GUI a program according to the present invention to be described later.

The hardware of a preferred computer system used for this purpose is IBM® System X. In this case, for example, the CPU0 304a, CPU1 304b, CPU2 304c, and CPU3 304d are Intel® Core 2 DUO, and the operating system is Windows® Server 2003. The operating system is stored in the hard disk drive 316 and read from the hard disk drive 316 into the main memory 306 upon startup of the computer system.

Note that the hardware of the computer system usable for carrying out the present invention is not limited to IBM® System X, and any computer system can be used as long as the computer system can run an ECU emulator program and a physical unit simulator program. The operating system is not also limited to Windows®, and any operating system such as Linux® or Mac OS® can be used. Further, in order to run the ECU emulator program and the physical unit simulator program at high speed, a POWER® 6-based computer system such as IBM® System P with operating system AIX® may also be used.

Further, multiple ECU emulator programs, multiple physical unit simulator programs, and a program according to the present invention, which makes these multiple emulator programs and physical unit simulator programs cooperate with each other to conduct a test, can be stored in the hard disk drive 316 in a manner to be started and manipulated through the keyboard 310 and the mouse 312.

In order to realize full-vehicle SILS, all the ECU emulator programs and the physical unit simulator programs used in one automobile are preferably stored in the hard disk drive 316.

Note the use of the terms "emulator" and "simulator" here. An ECU code originally written by assuming that the code runs on another processor is set to run using CPU0 to CPU3, for example, as targets. This is called emulation and a program for performing the emulation is called an emulator. Meanwhile, a system for virtually calculating the operation of a physical system such as an engine is called a simulator.

Figure 4:
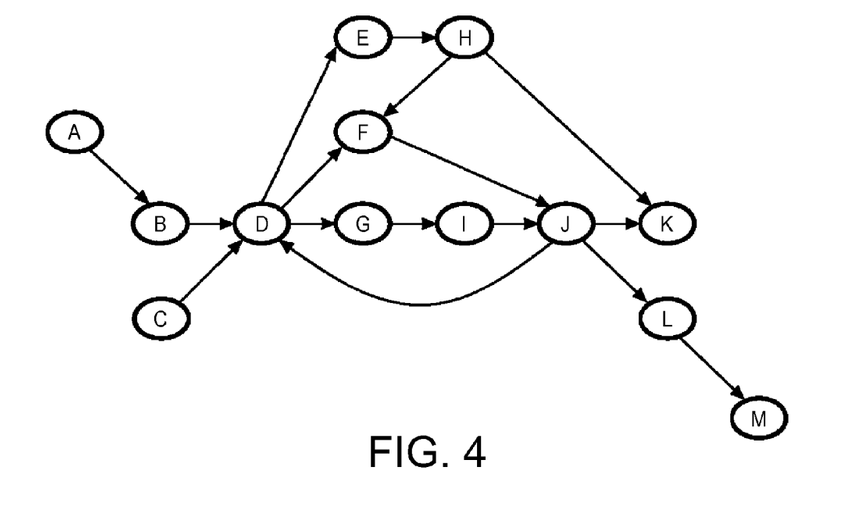
FIG. 4 is a block diagram of functional blocks.

In the hard disk drive 316, a block diagram of functional blocks created by MATLAB®/Simulink® as a simulation modeling system developed by MathWorks Inc. is stored in a predetermined data format. In other words, use of MATLAB®/Simulink® enables the operator to arrange functional blocks A, B, . . . , M on the screen through a graphical interface as shown in FIG. 4 and specify a flow of processing as indicated by the arrows to create a simulation program. In general, the block diagram in MATLAB®/Simulink® is to describe the behavior of one time step of the system to be simulated. This is repeatedly calculated for a specified time period to obtain the behavior of the system in chronological order.

Figure 6:
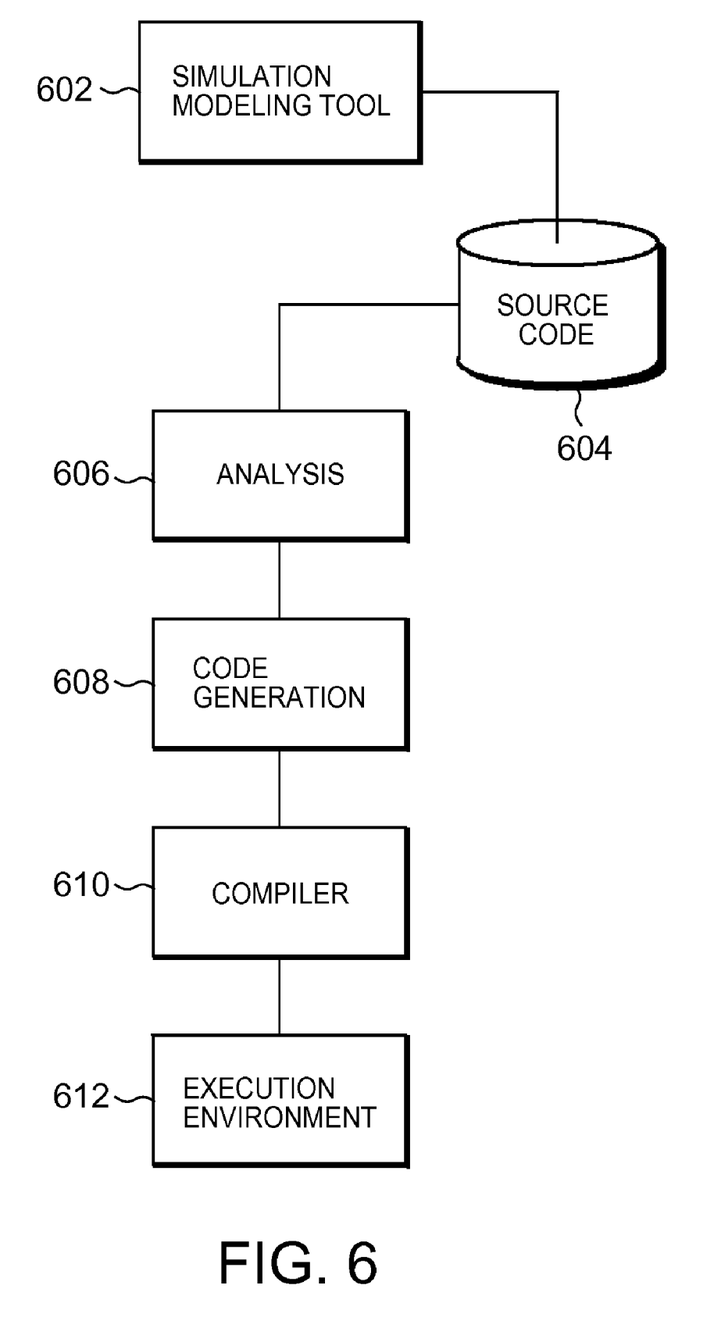
FIG. 6 is a logical block diagram of a functional module.

FIG. 6 is a block diagram of a tool for processing a simulation program according to the present invention. In FIG. 6, a simulation modeling tool 602 may be any existing tool such as MATLAB®/Simulink® or Scilab/Scicos. Basically, the simulation modeling tool 602 has the function of enabling the operator to arrange the functional blocks in a GUI manner on the display 314, describe necessary attributes such as equations, and associate the functional blocks with each other as required to describe the block diagram. The simulation modeling tool 602 also has the function of outputting C source code describing a function equivalent to the block diagram described. C++, FORTRAN, or other coding constructs can be used instead of C. Further, a file for describing dependencies between functional blocks can be generated as an MDL file in a format unique to Simulink®.

Further, the simulation modeling tool may be incorporated in another personal computer so that source code generated there can be downloaded to the hard disk drive 316 via a network.

Source code 604 thus output is stored in the hard disk drive 316. Source code 604 is analyzed using an analysis module 606. The main purpose of this analysis related to the present invention is to find an entry point of the program indicated in the source code 604.

Figure 5:
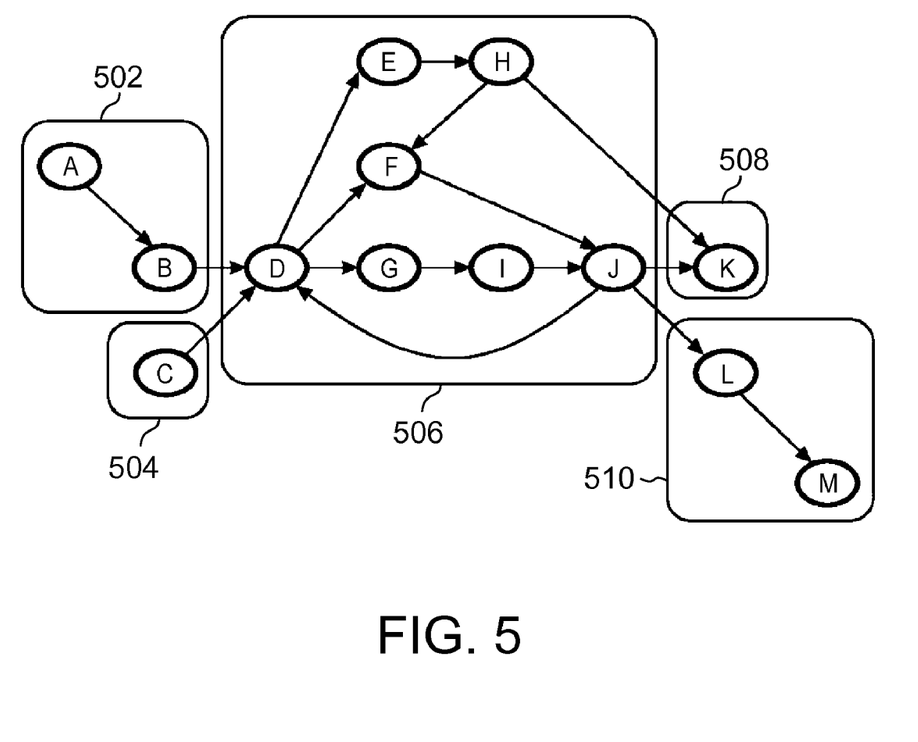
FIG. 5 is a diagram showing strongly-connected components of the functional blocks.
Figure 7:
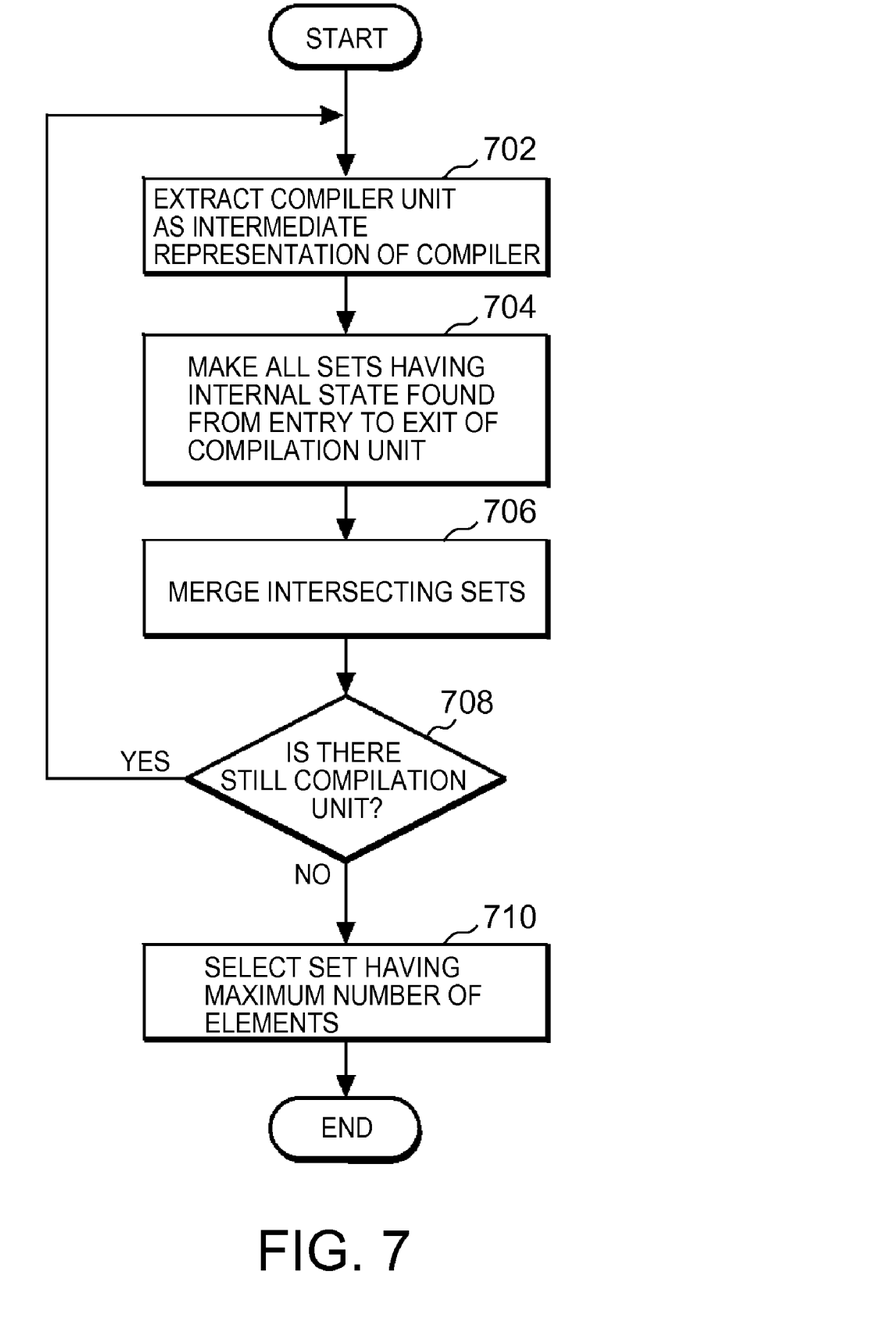
FIG. 7 is a flowchart showing processing for determining an entry point.

FIG. 7 shows processing therefor. Before starting the processing in FIG. 7, the analysis module 606 divides the source code 604 into strongly-connected components as compilation units as shown in FIG. 5. In FIG. 5, regions 502, 504, 506, 508, and 510 are examples of regions of strongly-connected components. Here, being "strongly-connected" means that a directed path exists between any two points on a graph when considering the source code 604 to be a control flow and the control flow to be a directed graph. For example, for the details of techniques for finding strongly-connected components in the control flow, refer to Japanese Patent Application Publication No. 9-319722 and Japanese Patent Application Publication No. 2004-272826 related to the present applicant.

In FIG. 7, the analysis module 606 extracts in step 702 a compilation unit as a strongly-connected component.

In step 704, the analysis module 606 makes up sets of all functional blocks having internal states found from the entry to exit of the compilation unit. In step 706, the analysis module 606 merges intersecting sets. Here, "intersecting" means that sets are connected to each other.

In step 708, the analysis module 606 determines whether there is still a compilation unit, and if there is any compilation unit, control proceeds to step 702 to repeat processing.

In step 708, if the analysis module 606 determines that there is no unprocessed compilation unit, the analysis module 606 selects in step 710 a set having the maximum number of elements. The entry to the set is an entry point to be found.

Returning to FIG. 6, when finding the entry point, the analysis module 606 passes information on the entry point to a code generation module 608.

The code generation module 608 generates code based on the original code using the entry point as its base point. It is shown in FIG. 8.

Figure 8:
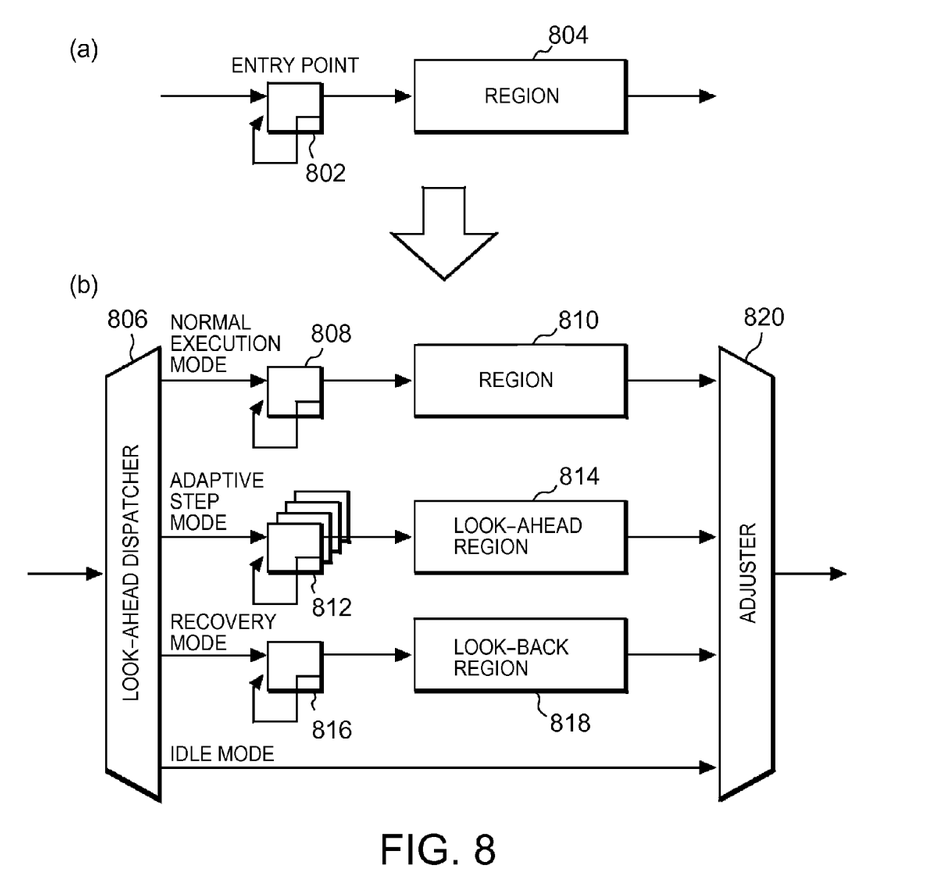
FIG. 8 contains diagrams showing the conversion and addition of codes around the entry point.

FIG. 8(*a*) shows the original code. The original code consists of an entry point 802 and a subsequent region 804.

The code generation module 608 generates four kinds of code from this original code as shown in FIG. 8(*b*). One of them is code consisting of an entry point 808 and a region 810. This is substantially the same as the original code. Execution from the entry point 808 to the region 810 is called a normal execution mode.

The second is code consisting of an entry point 812 and a region 814. The region 814 is also called a look-ahead region. The look-ahead region 814 has the function of starting execution at a higher speed than the normal execution mode on condition that the input is substantially constant. Execution from the entry point 812 to the region 814 is called an adaptive step mode. The adaptive step mode will be described in detail later with reference to a flowchart.

The third is code consisting of an entry point 816 and a region 818. The region 818 is also called a look-back region. The look-back region 818 has the function of starting execution by returning to the point of time when the input has come. Execution from the entry point 816 to the region 818 is called a recovery mode. The recovery mode will be described in more detail later with reference to a flowchart.

The fourth is a mode for giving interpolated outputs based on the outputs in adaptive steps. The mode is called an idle mode.

The code generation module 608 puts code called a look-ahead dispatcher 806 at the top of each of the four kinds of codes. The look-ahead dispatcher 806 has the function of assigning processing to any one of the above four kinds of modes according to the conditions for an incoming signal. The look-ahead dispatcher 806 will be described in more detail later with reference to a flowchart.

Further, the code generation module 608 adds code of an adjuster 820 at the end of each of the four kinds of codes. The adjuster 820 has the function of generating output whose time-series output values are interpolated, especially during the period of the idle mode. This interpolation may be a general linear interpolation.

Returning to FIG. 6, the code thus generated is compiled by a compiler 610 into an executable binary code, and preferably once stored in the hard disk drive 316. Then, the code is loaded to the main memory 306 and executed in an execution environment 612 through the operating system.

The analysis module 606, the code generation module 608, and compiler 610 in FIG. 6 are preferably stored in the hard disk drive 316 so that they will be loaded to the main memory 306 and executed through the operating system in response to user's operations.

Figure 9:
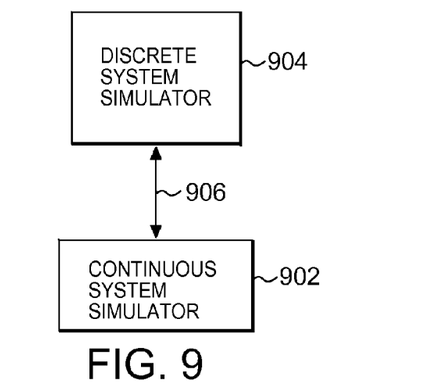
FIG. 9 is a schematic block diagram showing cooperation between a discrete system and a continuous system.

FIG. 9 is a diagram showing part of the simulation system. The simulation system is SILS to execute all simulation components in the main memory 306. As shown in FIG. 9, examples of such components are a continuous system simulator 902, typically as an engine simulator, and a discrete system simulator 904, typically as an ECU emulator cooperating with the continuous system simulator 902. The continuous system simulator 902 is activated in response to continuous pulses to send event messages to the discrete system simulator 904 through a communication route 906 including a common memory and a CAN emulator. The discrete system simulator 904 responds with discrete event messages to the continuous system simulator 902 through a communication route 906.

The program created by the processing in FIG. 6 works as the discrete system simulator 904 in FIG. 9.

Figure 10:
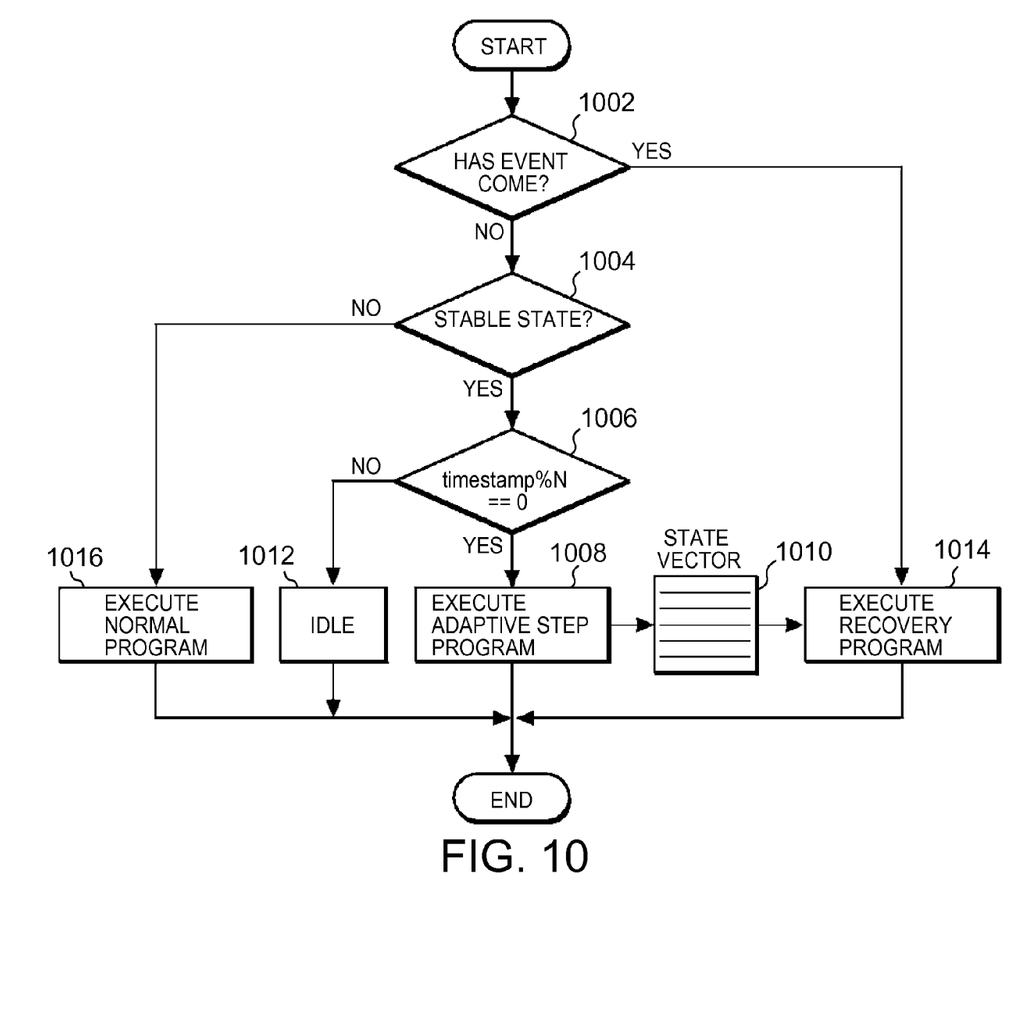
FIG. 10 is a flowchart showing the operation of a look-ahead dispatcher.

FIG. 10 is a flowchart showing processing of the look-ahead dispatcher 806 in FIG. 8. In FIG. 10, a program (hereinafter called the discrete system simulator according to the embodiment) created by the processing in FIG. 6 determines in step 1002 whether an event has come. Here, "an event has come" means that the discrete system simulator 904 receives an event message from the continuous system simulator 902 in FIG. 9.

If no event has come in step 1002, control proceeds to step 1004 to determine whether the state is the stable state. Here, the determination as to whether the state is the stable state can be made by processing as shown in a flowchart of FIG. 11, for example.

Figure 11:
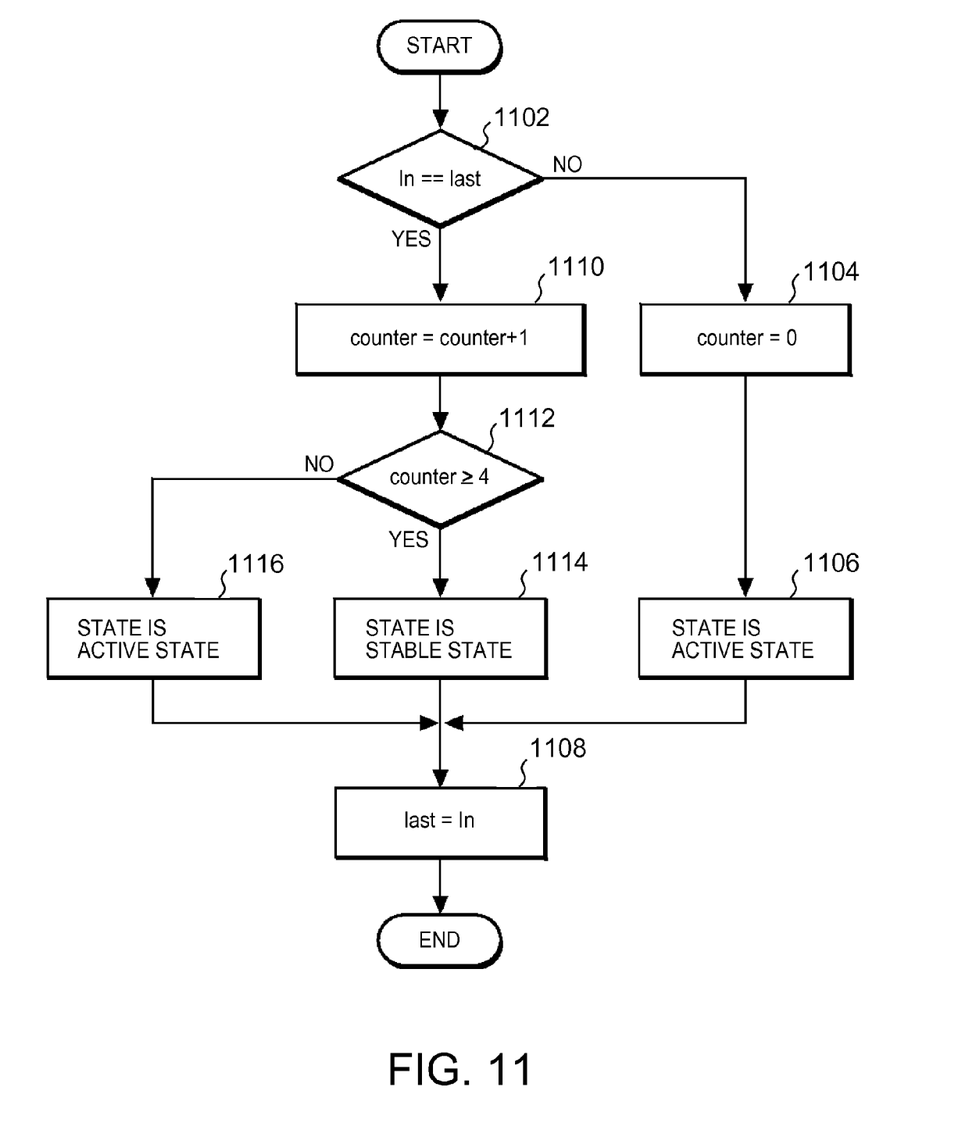
FIG. 11 is a flowchart showing processing for distinguishing between an active state and a stable state.

In other words, in step 1102 of FIG. 11, it is determined whether In as the current input is equal to last as the previous input. If it is determined that it is not equal, control proceeds to step 1104 to set a counter value to 0. Then, in step 1106, the state is determined to be the active state, and in step 1108, In is substituted for last. After that, the determination processing is ended.

If it is determined in step 1102 that In as the current input is equal to last as the previous input, the counter value is incremented by one in step 1110.

In step 1112, it is determined whether the counter value is four or more. If so, because it means that the same input value continues for a predetermined period, the state is determined in step 1114 to be the stable state, and in step 1108, In is substituted for last. After that, the determination processing is ended. Note that the counter threshold value of 4 to determine the stable state is an illustrative example, and any larger value can be selected appropriately depending on the system environment.

If it is determined in step 1112 that the counter value is not four or more, because it means that the same input does not continue so much longer, the state is determined in step 1116 to be the active state, and in step 1108, In is substituted for last. After that the determination processing ends.

Returning to FIG. 10, when the state is determined in step 1004 to be the active state in the manner mentioned above, the look-ahead dispatcher 806 executes the program shown in the region 810 of FIG. 8 in the normal execution mode. In this case, because the execution speed is the same as that of the original program, the execution speed of the program is not increased at all.

When the state is determined in step 1004 to be the stable state, it is then determined in step 1006 whether the timestamp percentage N is zero, that is, whether the remainder of the timestamp divided by N is zero. Here, N is an appropriate integer equal to or greater than 2. Such a determination causes the look-ahead dispatcher 806 to call step 1008 to execute an adaptive step program once every N times depending on the timestamp value.

The reason why step 1008 is not called immediately from step 1004 is because step 1008 for executing the adaptive step program is generally relatively heavy processing and computational resources need saving. Therefore, as a result of determination in step 1006, calling of step 1008 is reduced to once every N times. Note that step 1008 may be called according to the determination of the stable state every time depending on the embodiment.

The adaptive step program in step 1008 is the program shown in the look-ahead region 814 as the adaptive step mode in FIG. 8, involving the writing of a value to a state vector 1010 as shown in FIG. 10. The state vector 1010 is typically a predetermined memory partition allocated in the main memory 306, and is written as an array of structures in C language. The details of the adaptive step program in step 1008 will be described with reference to a flowchart of FIG. 12.

Figure 12:
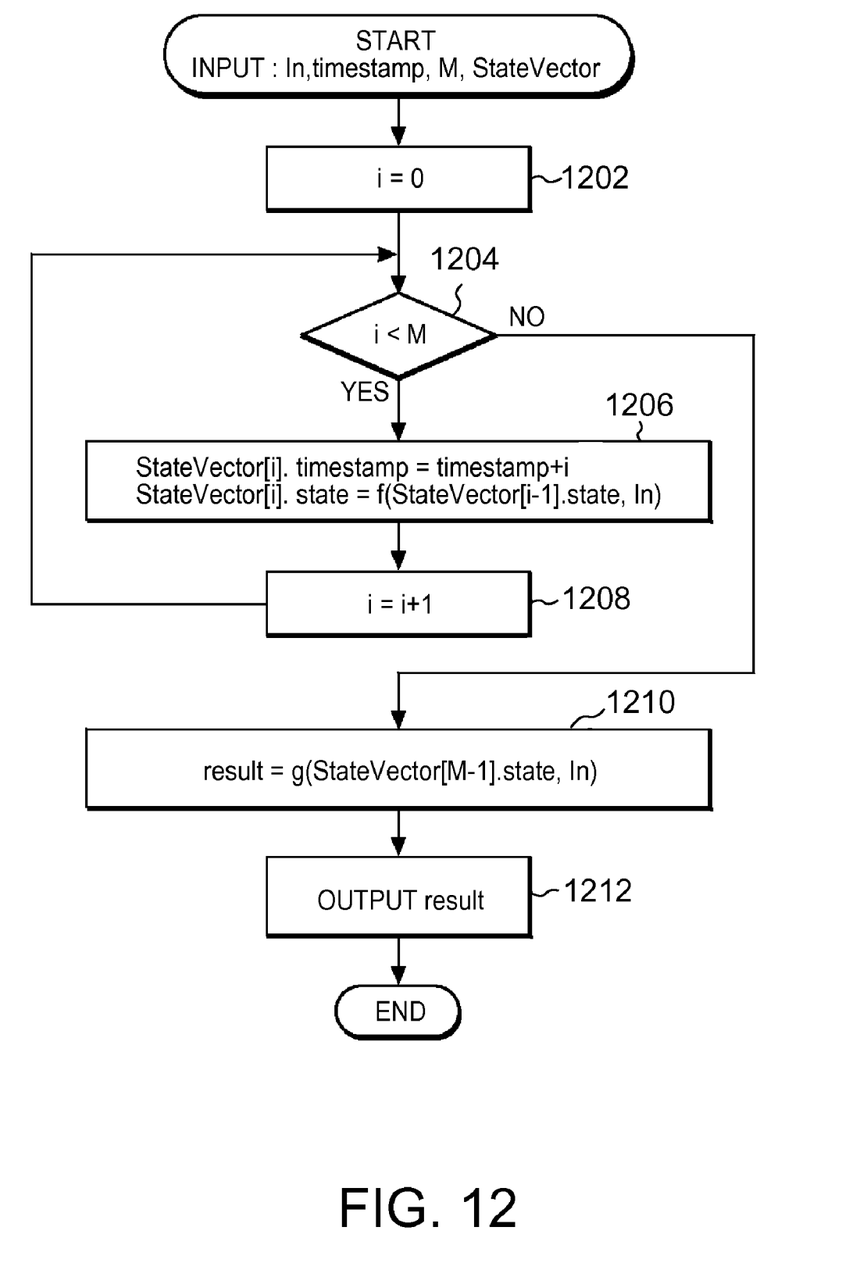
FIG. 12 is a flowchart showing processing of an adaptive step program.

As shown in FIG. 12, the adaptive step program is a routine or a function using, as arguments, input data In, timestamp, order M of the state vector 1010, and a pointer to the state vector.

In FIG. 12, variable i is set to zero in step 1202. The variable i is used to access elements of the state vector as the array of structures.

In step 1204, it is determined whether i is smaller than the order M of the state vector 1010. If so, the following processing is performed in step 1206:

StateVector[$i$].timestamp=timestamp+$i$

StateVector[$i$].state=$f$(StateVector[$i$-1].state,In)

As apparent from the above description, StateVector is an array of structures having a timestamp and a state variable.

While incrementing i by one in step 1208, step 1206 is repeated until i reaches M.

When i reaches M, the processing proceeds to step 1210 as a result of determination in step 1204 to calculate result according to the following equation:

result=$g$(StateVector[$M$-1].state,In)

In step 1212, the value of result obtained as a result of the calculation in step 1210 is output, and the processing ends.

Returning to step 1006 in the flowchart of FIG. 10, if it is determined that the timestamp percentage N is not zero, the processing shifts to step 1012 to execute an idle step.

The basic operation of the idle step 1012 is to cooperate with the adjuster 820 to give interpolated outputs based on the output of the adaptive step program.

Figure 13:
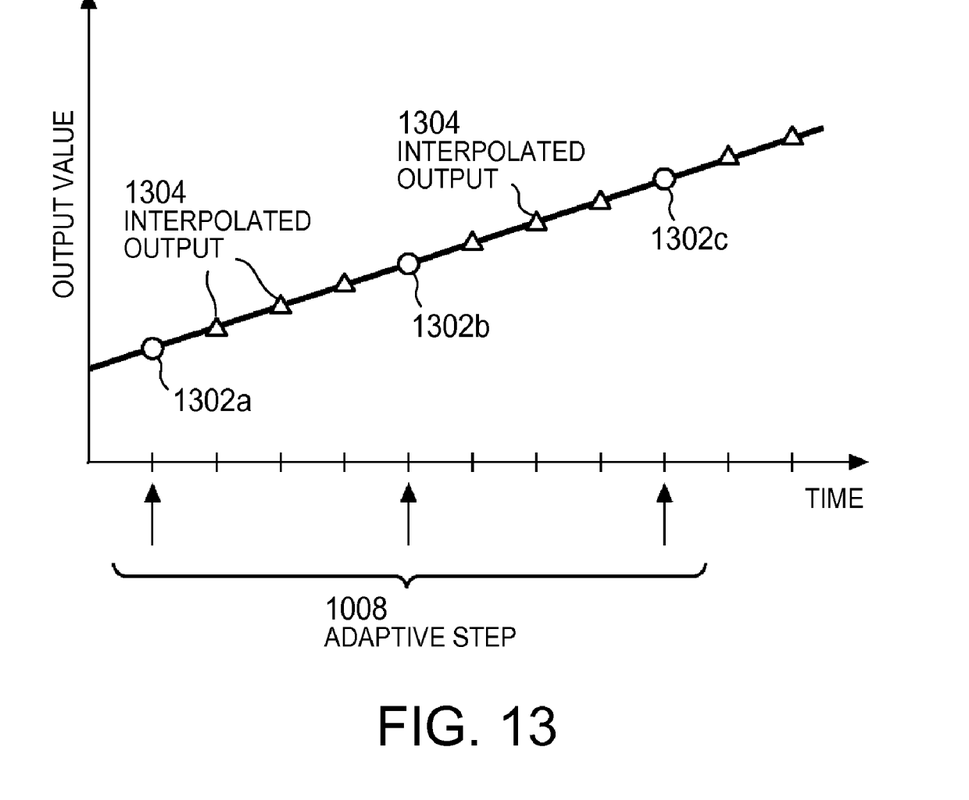
FIG. 13 is a chart showing interpolation processing in an idle state.

The operation of the adjuster 820 in the idle step can be understood well from FIG. 13. In other words, the adaptive step 1008 is to give an output every four timestamps. The outputs given are indicated by circle marks 1302*a*, 1302*b*, and 1302*c* in FIG. 13.

The adjuster 820 records the outputs of the adaptive step program sequentially to give interpolated outputs 1304 as indicated by triangle marks at timing of calling the idle step 1012 based on the values of the recorded outputs of the adaptive step program. The interpolation calculation can be made by any existing method such as linear interpolation, Lagrange interpolation, or least-square interpolation.

In the stable state shown in FIG. 1, it can be reasonably assumed that the replacement of actual outputs with these interpolated outputs 1304 does not cause a large error so much. Further, the cost for calculating the interpolated outputs is lower than the output calculation in the adaptive step (that is, calculation like g(StateVector[M−1].state, In) mentioned above), and this point also has the advantage of improving the processing speed.

Returning to step 1002 in the flowchart of FIG. 10, when the look-ahead dispatcher 806 detects that an event has come, the processing proceeds to step 1014 to call a program shown in the look-back region 818 indicated as the recovery mode in FIG. 8. As shown, step 1014 for recovery program execution references the value of the state vector 1010. The details of the recovery program in step 1014 will be described with reference to a flowchart of FIG. 14.

Figure 14:
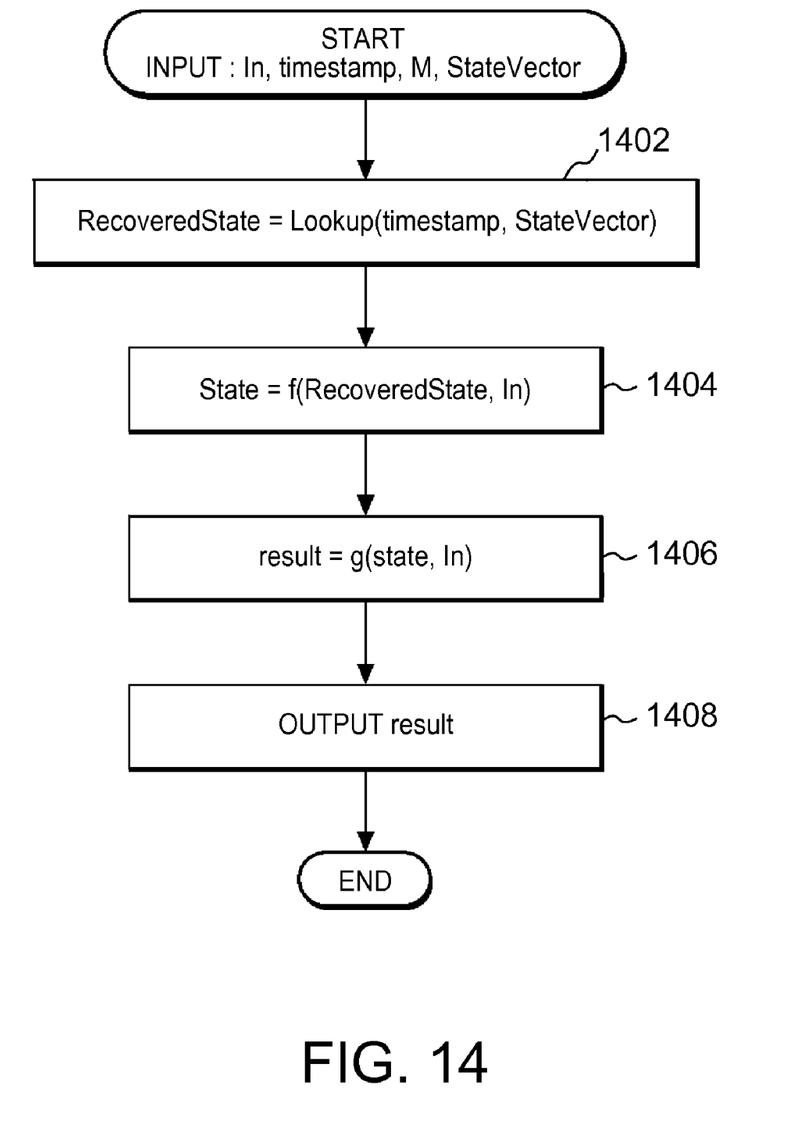
FIG. 14 is a flowchart of recovery processing.

As shown in FIG. 14, the recovery program is a routine or a function using, as arguments, data value In of the incoming event, timestamp, order M of the state vector 1010, and a pointer to the state vector.

In step 1402, the elements of the state vector are looked up by a function Lookup with the timestamp included in the data of the incoming event. Lookup(timestamp, StateVector) returns a value equal to the timestamp of the entry of the state vector or a state value stored in an element of the state vector, which is located before the timestamp and has a value closest to the timestamp. If it is expressed as RecoveredState, state as a new internal state is calculated in step 1404 according to the following equation:

$$state = f(RecoveredState, In)$$

This f( ) is equivalent to the f( ) shown in the flowchart of FIG. 12.

In step 1406, result as a result value is obtained by the following equation:

$$result = g(state, In)$$

This g( ) is equivalent to the g( ) shown in the flowchart of FIG. 12.

In step 1408, result as the result value is output, and the processing is ended.

Next, another example of a recovery program independent of the state vector will be described.

If the current state is $state_{cur}$, the previous state is $state_{prev}$, and the previous input value is $In_{prev}$, it can be found from the above description that the following equation holds:

$$state_{cur} = f(state_{prev}, In_{prev})$$

This can be rewritten as follows:

$$state_{prev} = f^{-1}(state_{cur}, In_{prev})$$

Note that $f^{-1}( )$ is an inverse function of f( ).

Returning to the flowchart of FIG. 10, it is assumed that it is determined in step 1002 that a new event has come. In this case, if the input value of the new event is In and the state on that occasion is $state_{cur}$, the input of the new event is no longer effective.

Therefore, the immediately preceding state $state_{prev}$ is first determined by $state_{prev} = f^{-1}(State_{cur}, In)$ and then $state_{cur}$ is recalculated by $State_{cur} = f(State_{prev}, In)$, making $state_{cur}$ be at a proper state value for the current In.

Thus, a proper result can be obtained by calculating result=g($state_{cur}$, In).

While this invention has been described based on the specific embodiment, this invention is not intended to be limited to this specific embodiment. It should be appreciated that various modifications, configurations and techniques for replacement, which are apparent to those skilled in the art, are applicable. For example, this invention is not restricted by the architecture of a specific processor, or the platform of the computer system.

In the aforementioned embodiment, the simulation system is associated with speeding up in a vehicle SILS simulation system for automobiles, but the invention is not limited to such an example. It will be appreciated by those skilled in the art that the invention is widely applicable to various simulation systems for aircrafts, robots, and other physical systems.

What is claimed is:

1. A simulation system for performing simulation according to operation of a computer, the simulation system comprising:
    means for determining whether an input state is stable;
    means for running an adaptive processing routine that executes a plurality of steps at a time in response to the determination that the input state is stable;
    means for running a normal processing routine that executes one step at a time in response to the determination that the input state is not stable; and
    means for running a recovery routine in which a state to be recovered is determined based on an event input in response to the event input to restart processing from a point of the event input using the state to be recovered.

2. The simulation system according to claim 1, wherein the adaptive processing routine is to store a state together with a timestamp sequentially for each step of the plurality of steps, and the means for running the recovery routine references the stored state based on the timestamp of the event to realize the state to be recovered.

3. The simulation system according to claim 1, further comprising:
    means for storing input values of events sequentially; and
    means for calculating the state to be recovered based on the stored input values and a current state value.

4. The simulation system according to claim 1, further comprising:
    means for temporally interpolating outputs of the adaptive processing routine; and
    means for outputting the interpolated outputs.

5. A simulation method of performing simulation according to operation of a computer, the simulation method comprising the steps of:
    determining whether an input state is stable;
    running an adaptive processing routine that executes a plurality of steps at a time in response to the determination that the input state is stable;
    running a normal processing routine that executes one step at a time in response to the determination that the input state is not stable; and
    running a recovery routine in which a state to be recovered is determined based on an event input in response to the event input to restart processing from a point of the event input using the state to be recovered.

6. The simulation method according to claim 5, wherein the adaptive processing routine is to store a state together with a timestamp sequentially for each step of the plurality of steps, and the step of running the recovery routine is to reference the stored state based on the timestamp of the event to realize the state to be recovered.

7. The simulation method according to claim 5, further comprising the steps of:
  storing input values of events sequentially; and
  calculating the state to be recovered based on the stored input values and a current state value.

8. The simulation method according to claim 5, further comprising the steps of:
  temporally interpolating outputs of the adaptive processing routine; and
  outputting the interpolated outputs.

9. A program for performing simulation according to operation of a computer, the program causing the computer to execute the steps of:
  determining whether an input state is stable;
  running an adaptive processing routine that executes a plurality of steps at a time in response to the determination that the input state is stable;
  running a normal processing routine that executes one step at a time in response to the determination that the input state is not stable; and
  running a recovery routine in which a state to be recovered is determined based on an event input in response to the event input to restart processing from a point of the event input using the state to be recovered.

10. The program according to claim 9, wherein the adaptive processing routine is to store a state together with a timestamp sequentially for each step of the plurality of steps, and the step of running the recovery routine is to reference the stored state based on the timestamp of the event to realize the state to be recovered.

11. The program according to claim 9, further comprising the steps of:
  storing input values of events sequentially; and
  calculating the state to be recovered based on the stored input values and a current state value.

12. The program according to claim 9, further comprising the steps of:
  temporally interpolating outputs of the adaptive processing routine; and
  outputting the interpolated outputs.

\* \* \* \* \*